Sept. 1, 1959 L. CHANZIT ET AL 2,902,654

UHF OSCILLATOR

Filed Sept. 27, 1955 6 Sheets-Sheet 1

INVENTORS,
Lawrence Chanzit,
Martin E. Klein

BY Moses, Nolte, Crews & Berry
ATTORNEYS

INVENTORS,
Lawrence Chanzit,
Martin E Klein

BY Moses, Nolte, Crews & Berry
ATTORNEYS

INVENTORS,
Lawrence Chanzit,
Martin E. Klein

BY Moses, Nolte, Crews & Berry
ATTORNEYS

INVENTORS,
Lawrence Chanzit,
Martin E. Klein

BY Moses, Nolte, Crews & Berry
ATTORNEYS

INVENTORS,
Lawrence Chanzit,
Martin E. Klein

BY Moses, Nolte, Crews & Berry
ATTORNEYS

Sept. 1, 1959 L. CHANZIT ET AL 2,902,654

UHF OSCILLATOR

Filed Sept. 27, 1955 6 Sheets-Sheet 6

INVENTORS,
Lawrence Chanzit,
Martin E. Klein

BY Moses, Nolte, Crews & Berry
ATTORNEYS 2,902,654

UHF OSCILLATOR

Lawrence Chanzit, Bronx, N.Y., and Martin E. Klein, West Englewood, N.J., assignors to The W. L. Maxson Corporation, New York, N.Y., a corporation of New York Application September 27, 1955, Serial No. 536,927

13 Claims. (Cl. 331—97)

This invention relates to a tunable, ultra-high frequency, wide band, power oscillator, particularly of the type utilizing a disk-seal triode tube and dual cavity coaxial line.

Previous oscillators of this type have had limited tuning ranges and low power outputs. If operation in higher modes was used to obtain higher oscillation frequencies, jumping to undesirable modes of oscillation and discontinuities of the tuning range were encountered. To reduce the likelihood of such mis-operation circuits and apparatus were added which reduced the output power and introduced new problems.

It is an object of the present invention to provide an oscillator which is capable of calibrated tuning over an extremely wide frequency band, having a range, for example, of 10 to 1 or more.

It is a further object of the invention to provide an oscillator capable of reliable and stable operation in a plurality of different modes of oscillation.

It is another object of the invention to provide an oscillator oscillating in several different modes with optimum feedback and optimum output in each mode.

It is another object of the invention to simplify the tuning and adjustment of a coaxial line oscillator adapted to oscillate in several modes.

It is still another object of the invention to reduce the effects of load variations on the frequency of oscillation.

The improved oscillator according to this invention is basically of the Colpitts type using sections of transmission line as resonant elements, with the tube interelectrode capacity acting as a part of the resonant circuits and partially as a feedback element, in conjunction with the mechanical feedback element.

Mechanically the oscillator is an assembly of three concentric cylinders with the plate grid cavity consisting of the volume bounded by the external cylinder and middle cylinder, and the cathode grid cavity bounded by the middle cylinder and the inner cylinder. The effective lengths of the resonant cavity is determined by the motion of two plungers, one in each cavity, which are capable of movement over approximately a twelve inch range. The operation of the oscillator involves simultaneously tuning both the plate and cathode cavities. This requires the adjustment of the plungers to such a distance that the reactances offered by the cavities create a condition of approximately parallel resonance in conjunction with the interelectrode capacities of the oscillator tube. In accordance with transmission line theory, this condition may be satisfied when the length of the cavity approximates an odd integral number of ¼ wave lengths of the frequency desired. The present oscillator is designed to operate in the one quarter and three quarter mode, operation from 200 to approximately 1000 mcs. being in the one quarter wave mode and 1000 to 3000 mcs. in the three quarter wave mode. In operation, the plate plunger is set to a calibrated length conforming to the required frequency. The cathode plunger is set to a slightly greater length so that the cavity looks like a small capacity to the oscillator circuit. The ratio of this capacity to the equivalent feedback capacity determines the feedback ratio of the oscillator circuit, and hence the amplitude and phase of the oscillator drive.

The feedback elements used in the one quarter and three quarter wave mode are chosen so that each element is of the optimum type to couple energy from the plate circuit into the grid circuit. Physically in the one quarter wave mode, capacity probes are used, since over the one quarter wave mode, the ends of the cavities are at a maximum voltage field. In the three quarter wave mode, inductive loops are used, since over the range of this mode, the volume adjacent to the feedback element is in a maximum current field. In this manner, feedback is optimized both for amplitude and phase over the frequency band. Abstraction of energy from the plate cavity is accomplished by means of mainly electric field coupling in the one quarter wave mode and mainly current field coupling in the three quarter wave mode. In the quarter wave mode, a loop is recessed into the cavity well and the output coupling is adjusted by a radial movement of a probe. In the three quarter wave mode, the loop is extended into the cavity and then completes the electrical coupling circuit through its configuration and capacity coupling to the output probe. Optimum power output from the oscillator is obtained by adjusting the depth of penetration into the field of either the probe or loop and adjusting to the condition which gives the best match between the load impedance and plate cavity. Because of the low impedance and high "Q" of the plate cavity, changes in the load have extremely small effects on the resonant frequency of the oscillator.

The oscillator is so designed, that for radio frequencies the plate is grounded through a by-pass condenser. This makes unnecessary any great amount of shielding of the oscillator. The bypass condenser simultaneously performs the function of blocking the D.C. voltage applied to the tube plate from ground.

The invention will be fully understood and other objects and features of the invention will become apparent from the following detailed description and the accompanying drawing in which.

Figure 1:
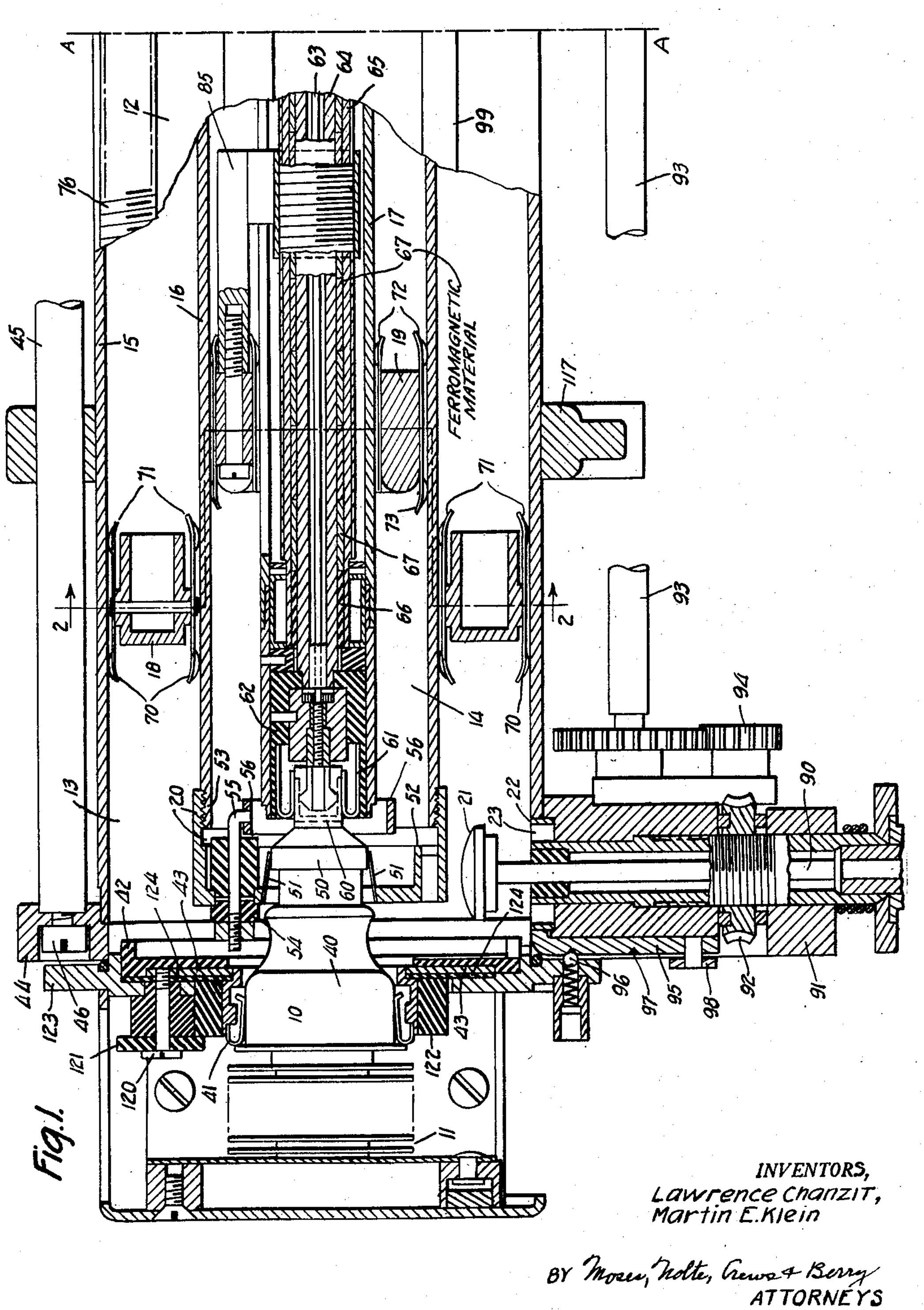
Fig. 1 is front view, partly in section, of the left end of one embodiment of the invention.
Figure 1A:
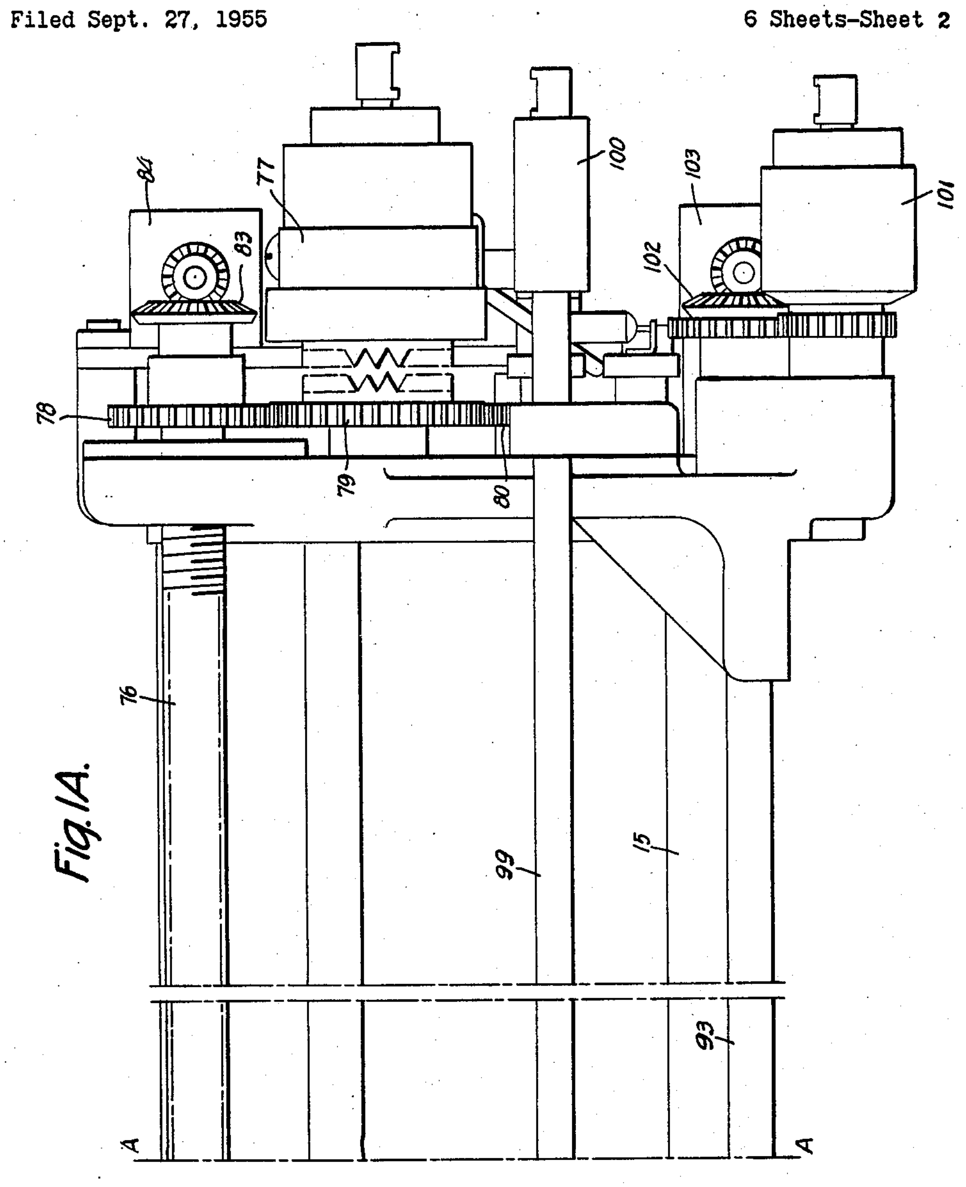
Fig. 1A is a front view of the right end of the same embodiment.
Figure 2:
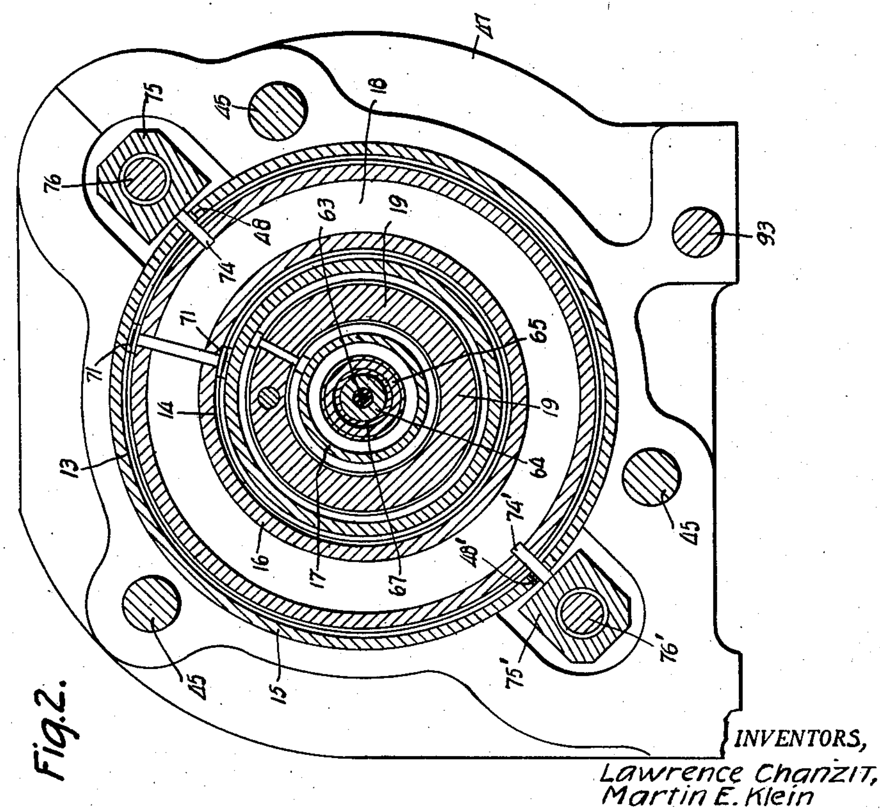
Fig. 2 is a sectional view taken along the line 2—2 of Fig. 1.

Referring to Figs. 1, 1A and 2 of the drawing, the electron tube 10 is a disk-seal triode, such as the type 2C39. It is provided with cooling fins 11 at its anode end. The cathode and heater are at the smaller end of the tube and a plane grid is interposed between the tube anode and cathode. A coaxial line assembly 12 provides a plate-grid cavity 13 and a cathode-grid cavity 14. Plate-grid cavity 13 includes an outer tubular member 15 coupled to the anode, a middle tubular member 16 coupled to the grid, and an inner tubular member 17 coupled to the cathode. Cavity 13 is tuned by an adjustable plunger 18 and cavity 14 is tuned by an adjustable plunger 19. Feedback from cavity 13 to cavity 14 is provided by a suitable coupling such as the feedback assembly 20. Power is abstracted from the oscillator by an adjustable output probe 21, or an adjustable coupling loop 22 in cooperation with probe 21.

Figure 5:
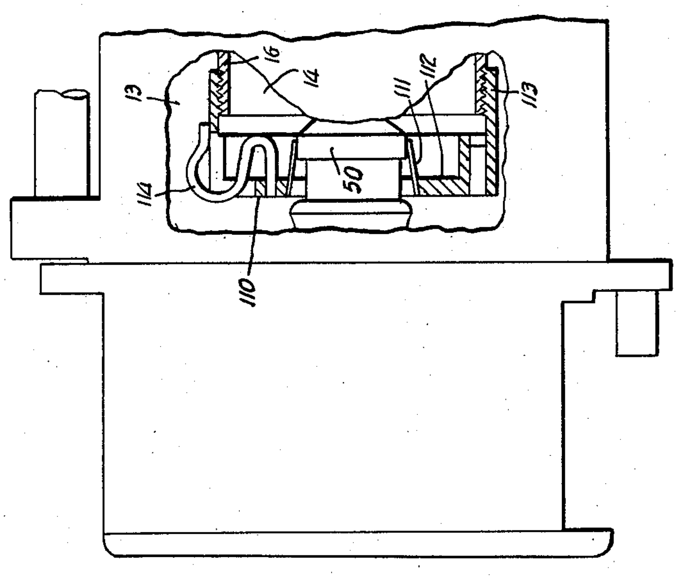
Fig. 5 is a partial sectional view of a feedback coupling for the high frequency range.
Figure 4:
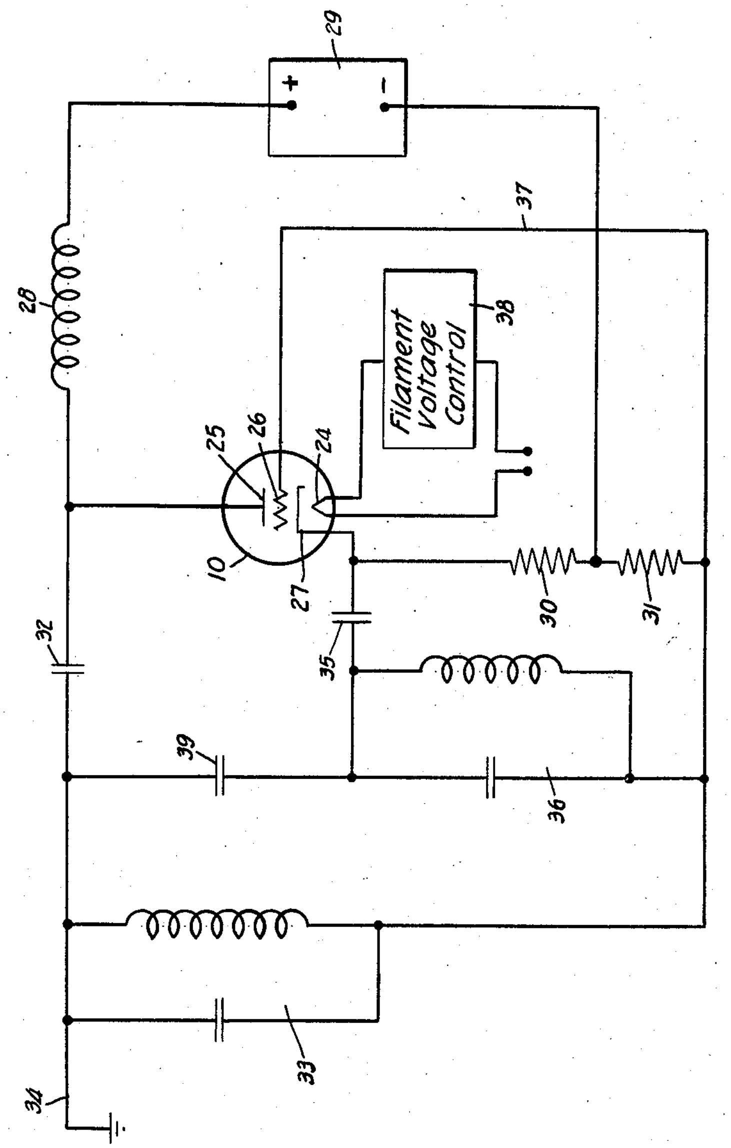
Fig. 4 is a circuit diagram of the oscillator.

The circuit of the oscillator may be represented as shown in Fig. 4. The anode 25 of tube 10 is connected through a suitable filter circuit or choke coil 28 to a source 29 of anode voltage, which may have a value, for example, of 1000 volts. The grid 26 is connected to the cathode 27 through biasing resistors 30, 31, and the junction of these resistors is connected to the negative terminal of voltage source 29. Anode 25 is connected also through a bypass condenser 32 to a resonant circuit 33, which corresponds to the plate-grid cavity 13. The anode 25 is grounded for R.F. by bypass condenser 32 and ground connection 34. Cathode 27 is connected through bypass condenser 35 to a resonant circuit 36 representing the grid-cathode cavity 14. Grid 26 is effectively grounded for D.C. by connection 37, but the R.F. potential of the grid floats at a value determined by the cathode and anode R.F. potentials. It can be seen, then, that the oscillator is essentially of the Colpitt type. This becomes quite evident if it is considered that the grid cathode cavity 14 represented by resonant circuit 36 is adjusted normally so as to be capacitive. It can be seen also that the magnitude and phase of the energy fed back from the anode to the grid-cathode circuit depend on the impedance of circuit 36 relative to that of the feedback reactance 39. Feedback is produced by coupling resonant circuits 33 and 36 by the capacitive feedback means 20 including the capacitive ring 56 and the open ended rod 55 (Fig. 1) or the inductive feedback means shown in Fig. 5, which will be described later. The filament 24 is connected to a unit 38 which comprises resistors and switches for automatically adjusting the filament voltage to compensate the effect of back heating of the cathode caused by transit time effects as the operating frequency is raised. The heater voltage is automatically adjusted as a result of storing either the low or high frequency feedback assembly in a holder in the filament voltage control unit 38. In essence, the position of the stored feedback assembly actuates specific switches which for the case of storage of the low frequency feedback assembly reduces the heater voltage to 5.0 volts, and for storage of the high frequency feedback assembly reduces the heater voltage to 5.5 volts. In addition, if neither feedback assembly is stored, the plate voltage is prevented from being applied to the oscillator tube.

Referring again to Figs. 1 and 2, the anode of tube 10 is provided with an external ring 40. A spring contact member 41 engages anode ring 40. Contact member 41 which is soldered to metal plate 43 is insulated from metallic plate 123 by a sandwich made up at several layers 124 of mica .005 inch thick to form the anode bypass condenser 32, Fig. 4. To prevent high voltage breakdown between 43 and 123 along the outer periphery of these two parts, an insulator 42 is inserted. Suitable means are provided for fastening together the several elements constituting the end wall structure of cavity 13. These means include the annular ring 44, threaded rods 45 (Fig. 2) and screws 46. Rods 45 extend through one or more frames 47 which provide a mounting means for the oscillator.

The grid terminal of cylinder 10 is an external ring 50 contacted by spring fingers 51 of the end wall 52 of the grid cathode feedback assembly 20. End wall 52 is conductively connected to the middle cylinder 16 by a threaded coupling 53. End wall 52 is part of the low frequency feedback assembly 20, which comprises an insulated bushing 54, three L-shaped rods 55 and a joined loop 56. One end of rod 55 extends into the anode grid cavity and the other end is connected to loop 56 in the grid cathode cavity. Rod 55 and ring 56 are spaced and insulated from the walls of the cavities. Ring 56 has a diameter intermediate those of the inner and middle cylinders 16 and 17 and is preferably concentric with said cylinders. The feedback coupling 20 feeds energy from cavity 13 to cavity 14 and thereby causes sustained oscillation.

Figure 3:
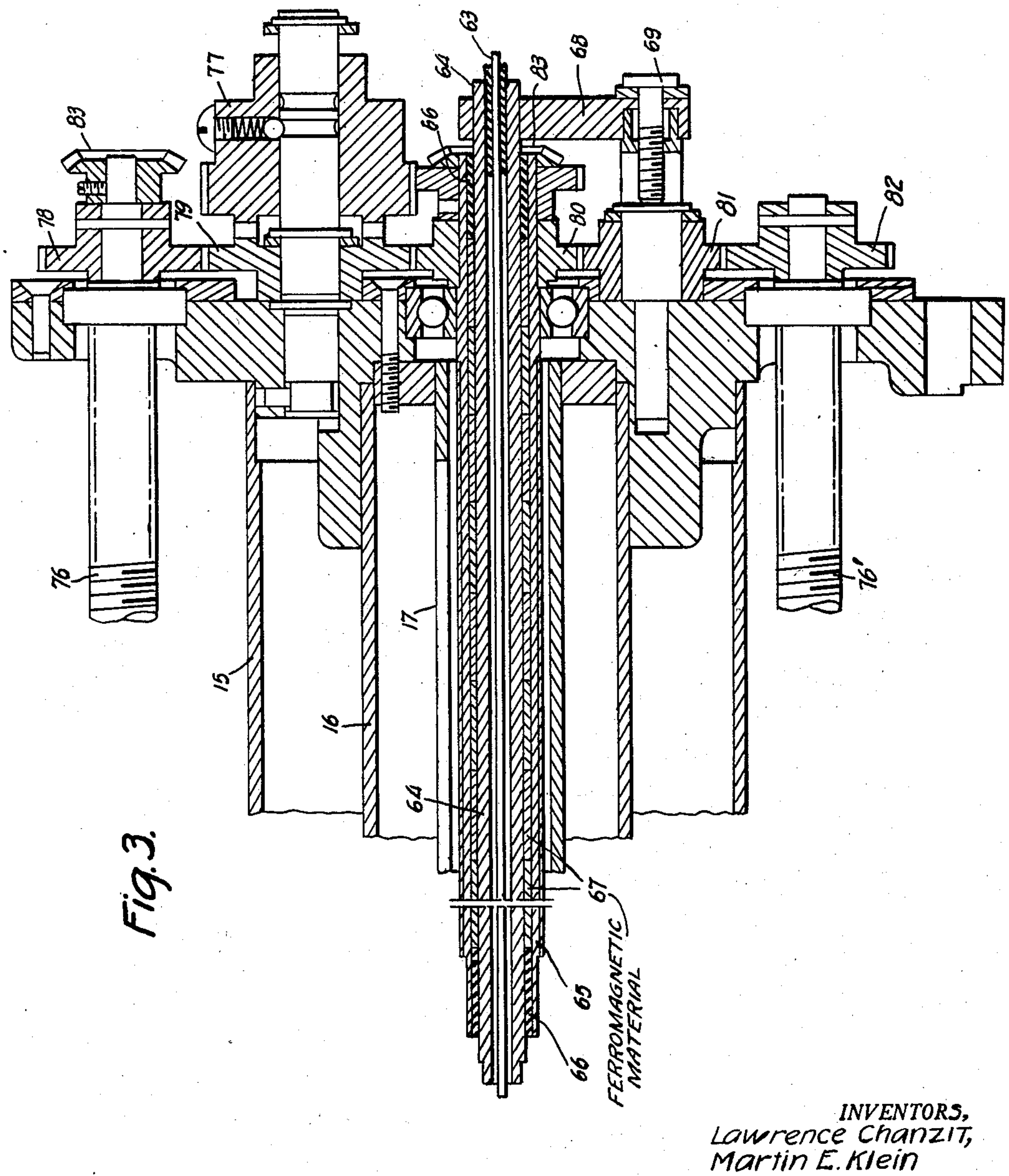
Fig. 3 is a partial sectional view of the control panel end of the oscillator.
Figure 3A:
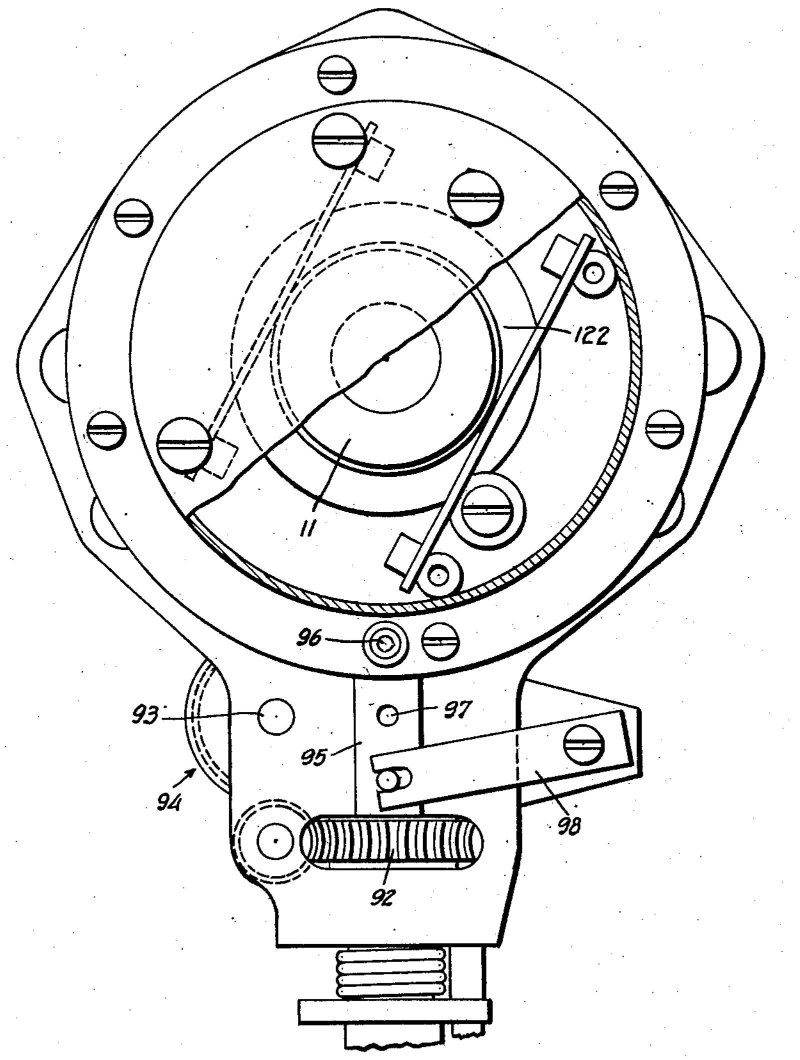
Fig. 3A is a view of the left end of Fig. 1.

The cathode terminal 60 of tube 10 is in contact with a spring connector 61. Connector 61 is insulated from inner cylinder 17 by a cylindrical dielectric lining sprayed on 62. The connector 61 and cylinder 17 have an appreciable capacitance between them and thus provide the cathode bypass condenser 35 of Fig. 4. The cathode heater leads are connected to concentric conductors 63 and 64 (Fig. 3). The heater leads 63, 64 extend through the entire coaxial line and are brought out at the right hand end thereof. Cylinder 64 is insulated from cylinder 65 by suitable bushings 66 inserted between these cylinders. Only a few such bushings 66 are required along the lengths of cylinders 64 and 65. In the remainder of the space between these cylinders, ferrite, or powdered iron, bushings or slugs 67 are inserted. The function of bushings 67 is to create a lossy medium which will attenuate any radio frequency energy which may be propagated down the line formed by the filament and cathode cylinders 64 and 65. Slugs 67 may be disposed along a major portion of the length or substantially the entire length of cylinders 64 and 65. Conductor 64 is connected by a bar 68 to a terminal 69 and conductor 63 is connected to another terminal (not shown) on the control panel. Since the cathode is connected to the heater, conductor 64 and terminal 69 provide a D.C. connection to the cathode.

Cavities 13 and 14 are tuned for operation at a given frequency by movement of plungers 18 and 19 (Fig. 1) to calibrated positions which may be indicated by mechanical counters. The plungers are circular, as shown in Fig. 2, and each plunger is provided with two sets of resilient contacts 70, 71 and 72, 73 (Fig. 1) which press against cylinders 15, 16, and 17. Plunger 18 is connected to nuts 75, 75' (Fig. 2) by pins 74, 74' which extend through slots 48, 48' in the outer cylinder 15. Nuts 75, 75' move along screws 76, 76' which can be turned by any suitable means, such as a knob 77 connected through gearing 78—82 (Figs. 3 and 1A) to screws 76, 76' to turn said screws in unison at the same rate. A bevel gear 83 is fixed to the upper screw 76 for driving a mechanical counter 84 (Fig. 1A). Knob 77 is retractable, and in the retracted position gear 79 is moved out of mesh with gears 78 and 80, but the geared portion of knob 77 remains in mesh with gear 83. Thus knob 77 may be positioned to drive screw 65 either alone or in unison with screws 76, 76'. Screw 65 is coupled to the carriage 85 which is in turn connected to plunger 19 through a suitable narrow slot 86 in cylinder 17. Hence plunger 19 can be adjusted by turning the cylindrical screw 65. It is evident that the two cavities 13 and 14 can be tuned simultaneously or cavity 14 alone can be tuned by means of the single tuning knob 77.

Output power is obtained by means of probe 21 and loop 22 (Fig. 1). Probe 21 includes an enlarged cap mounted on an output lead or stem 90. A threaded member 91 is fixed to stem 90 and a gear 92 is threaded on member 91. A shaft 93 is adapted to operate a drive mechanism 94 to turn gear 92 and thereby move member 91 radially to adjust the position of probe 21. Coupling loop 22 is shown retracted into recess 23, and in this location it has little effect. To obtain optimum coupling at the higher frequencies loop 22 is brought into operation by moving the loop support 95 upward until spring-pressed ball 96 falls into the slot 97. The loop 22, when in its elevated operative position, abstracts energy from the field through inductive coupling to the cavity and transfers this energy to probe 21, which acts as part of the loop which may be adjusted to give an optimum output. The loop 22 may be raised and lowered by means of linkage 98 connected between the loop support 95 and a shaft 99, which extends to the control panel. Shaft 99 is provided with a control knob 100 (Fig. 1A). Probe adjusting shaft 93 also extends to the control panel and is adapted to be operated by a knob 101. By means of gearing 102, shaft 93 is connected to a mechanical counter 103 which serves as an indicator.

The feedback assembly 20 shown in Fig. 1 is of the capacitive or electric type and gives an optimum coupling between the plate-grid cavity 13 and the cathode-grid cavity 14 when the cavities are energized in their quarter wavelength mode. In order to provide optimum feedback coupling when the cavities are operating in their three quarter wave-length mode, feedback coupling 20 is replaced by feedback assembly 110 shown in Fig. 5. Herein the grid ring 50 is in contact with resilient connector ring 111, which extends from an end closure plate 112. The end plate 112 forms the bottom of a cup-shaped member having a threaded wall 113, which screws onto the threaded end of the middle cylinder 16 of the coaxial line. An S-shaped, for example, coupling loop 114 is connected at one end to end plate 112 and at its other end to wall 113. Loop 114 extends through a slot in walls 112 and 113. One bend of loop 114 extends into the plate-grid cavity 13 and the other bend of loop 114 extends into the cathode-grid cavity 14. Loop 114 thus provides inductive or current coupling between cavities 13 and 14. The inductive loop is capable of providing optimum feedback coupling when the cavities are operating in the three quarter wave-length mode, because in this mode of oscillation the cavity space near the bends of loop 114 is near to a maximum current field. On the other hand, these end spaces of the cavities are close to a maximum voltage field when oscillation is occurring in the one quarter wavelength mode. In the latter mode, therefore, the capacitive feedback probe assembly 20 is most effective. Switching from the one quarter to the three quarter mode is accomplished by screwing feedback assembly 110 onto cylinder 16 in place of feedback assembly 20, and then turning knob 100 (Fig. 1A) to raise loop 22 to its operative position.

In one embodiment of the invention the oscillator was tunable from 200 to 1050 mcs./sec. in the one quarter mode, and from 1000 to 3000 mcs./sec. in the three quarter mode. The power output was 10 to 50 watts with the plate at 1000 volts and a load of 50 ohms. It is a feature of this invention that operation over the enormous frequency range of more than 10 to 1 is accomplished with an output probe which functions as either a capacitive probe or an inductive probe. This functioning is due to the fact that with proper adjustment of loop 22, probe 20 functions as part of an inductive loop coupling. This allows a single control to properly adjust the load coupling for both the capacitive and inductive modes of load coupling.

The D.C. voltage is connected to the anode of tube 10 through terminal 120 (Fig. 1) which is in contact with metallic plate 43. Metallic plate 43 is in contact with anode spring assembly 41. The provision of the anode and cathode bypass capacitors by the cavity structures themselves in the immediate vicinity of these electrodes has the important effect of eliminating the resistors and condensers which are placed in the cavity fields in general practice.

For the sake of simplicity various elements and circuits have not been shown. But it will be understood that suitable voltmeters, current meters, a power output meter, switches, overload relays, power supply and modulating means, indicators, filtering circuits, air blowers, and other accessories may be used. These devices are omitted because they are not requisite to an understanding of the invention and their inclusion would greatly complicate the disclosure.

There has been described in detail one illustrative embodiment of the invention. It will be apparent to those skilled in the art that numerous changes and modifications can be made and hence the spirit and scope of the invention is not to be construed as limited except as described in the following claims.

We claim:

1. An oscillator comprising a disk-seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders and ferromagnetic means surrounding the pair of heater conductors and located between said conductors and said third cylinder.

2. An oscillator according to claim 1, wherein and ferromagnetic means includes a plurality of powdered iron cylinders surrounding the heater conductors throughout a major portion of their length.

3. An oscillator comprising a disk-seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders, the grid connecting means forms an end wall of the second cylinder and is removably connected to the second cylinder, and feedback means extending through said grid connecting means.

4. An oscillator according to claim 3, wherein said feedback means includes an insulator, a rod extending through said insulator so that one end thereof is in the cavity formed by the first and second cylinders and the other end is in the cavity formed by the second and third cylinders, and a ring concentric with said cylinders and connected to said other end of the rod.

5. An oscillator comprising a disk-seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders, a conductive cylindrical plunger interconnecting the first and second cylinders, means for moving said plunger along said first and second cylinders, a second cylindrical conductive plunger interconnecting the second and third cylinders, a carriage connected to the second plunger, a screw member within and parallel to the third cylinder, said carriage having means extending through the third cylinder and engaging said screw so that rotation of the screw moves the second plunger along the second and third cylinders.

6. An oscillator according to claim 5, including means for rotating said screw member and actuating the means for moving the first plunger so that the positions of said first and second plungers are adjusted simultaneously and for rotating said screw member without actuating the means for moving the first plunger.

7. An oscillator comprising a disk-seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders, output means comprising a probe extending through the first cylinder, means for adjusting the radial extension of the probe into the cavity formed by the first and second cylinders, a conductive loop, and means for supporting said loop in said cavity adjacent to said probe.

8. An oscillator according to claim 7, including means for retracting said loop toward the wall of said first cylinder.

9. An oscillator according to claim 7 wherein said probe comprises a rod and a conductive cap on the portion of the rod in said cavity, said loop being concentric with said rod and retractable into a recess in the wall of the first cylinder.

10. An oscillator comprising a disk-seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders, means for abstracting high frequency power from the space between the first and second cylinders, said means comprising a rod having a portion extending into said space, and a ring concentric with said rod and in capacitive relation thereto.

11. An oscillator comprising a disk seal electron tube having an anode, a grid, a cathode, and a heater for the cathode, a plurality of coaxial conductive cylinders of different diameters disposed within one another, means connecting the anode to one end of the first outermost cylinder, means connecting the grid conductively to one end of a second cylinder located next to the outermost cylinder, means connecting the cathode to one end of a third cylinder located within the second cylinder, a pair of conductors located within the third cylinder, means connecting the heater directly to said conductors, the anode connecting means including a pair of conductive members and an insulating member separating said conductive members to form a capacitor, said cathode connecting means including a second pair of conductive members and an insulating member therebetween to form a capacitor, whereby the anode and cathode are capacitively coupled to their respective cylinders, a conductive cylindrical plunger interconnecting the first and second cylinders, a second cylindrical conductive plunger interconnecting the second and third cylinders, a control panel mounted on the other ends of the first, second and third cylinders, and means on said control panel for moving said first and second plungers along said cylinders in unison or individually.

12. An oscillator according to claim 11, including means for abstracting high frequency power from the space between two of said cylinders, said means comprising a probe extending into said space, and means mounted on said panel and connected to said probe for adjusting the extent of said probe into said space.

13. An oscillator according to claim 12, wherein said means for abstracting high frequency power includes a member in capacitive relation to said probe and means on said panel and connected to said member for moving said member along said probe.

References Cited in the file of this patent

UNITED STATES PATENTS

| | | |
|---|---|---|
| 2,412,805 | Ford | Dec. 17, 1946 |
| 2,428,622 | Gurewitsch | Oct. 7, 1947 |
| 2,446,405 | Bels | Aug. 3, 1948 |
| 2,472,204 | Fubini et al. | June 7, 1949 |
| 2,521,364 | Haller | Sept. 5, 1950 |
| 2,525,452 | Gurewitsch | Oct. 10, 1950 |
| 2,547,411 | Rambo | Apr. 3, 1951 |
| 2,747,086 | McArthur | May 22, 1956 |
| 2,782,265 | Stankey | Feb. 19, 1957 |